United States Patent
Katayama

(10) Patent No.: US 7,441,177 B2
(45) Date of Patent: Oct. 21, 2008

(54) INFORMATION REPRODUCTION APPARATUS AND METHOD USING MAXIMUM LIKELIHOOD DECODING

(75) Inventor: Tatsushi Katayama, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 567 days.

(21) Appl. No.: 10/992,790

(22) Filed: Nov. 22, 2004

(65) Prior Publication Data

US 2005/0122877 A1 Jun. 9, 2005

(30) Foreign Application Priority Data

Dec. 5, 2003 (JP) .............................. 2003-407577

(51) Int. Cl.
 *H03M 13/41* (2006.01)
(52) U.S. Cl. ...................... 714/795; 714/796
(58) Field of Classification Search ................. 714/795, 714/796; 369/59.18, 124.15
 See application file for complete search history.

(56) References Cited

U.S. PATENT DOCUMENTS

| | | | | |
|---|---|---|---|---|
| 4,774,682 | A | * | 9/1988 | White .......................... 702/109 |
| 4,953,183 | A | * | 8/1990 | Bergmans et al. ........... 375/348 |
| 5,131,011 | A | * | 7/1992 | Bergmans et al. ........... 375/348 |
| 5,270,876 | A | * | 12/1993 | Inoue et al. .................... 360/46 |
| 5,327,298 | A | * | 7/1994 | Ottesen et al. ................ 360/48 |
| 5,343,335 | A | * | 8/1994 | Hara ............................. 360/45 |
| 5,418,660 | A | * | 5/1995 | Sato et al. ..................... 360/65 |
| 5,424,882 | A | * | 6/1995 | Kazawa ........................ 360/46 |
| 5,450,389 | A | * | 9/1995 | Hayashi ................... 369/59.15 |

(Continued)

FOREIGN PATENT DOCUMENTS

JP 2001-250334 9/2001

OTHER PUBLICATIONS

Coker, J., et al., "Noise-Predictive Maximum Likelihood (NPML) Detection", IEEE Transactions on magnetics, vol. 34, No. 1, Jan. 1998, pp. 110-117.*

(Continued)

*Primary Examiner*—Stephen M Baker
(74) *Attorney, Agent, or Firm*—Fitzpatrick, Cella, Harper & Scinto

(57) ABSTRACT

An information reproduction apparatus using maximum likelihood decoding for calculating likelihood of a value of a reproducing signal to a plurality of reference values, the reproducing signal obtained from a recording medium, to decode the reproducing signal on the basis of the likelihood, the apparatus includes a circuit for detecting the reproducing signal from the recording medium, a circuit for detecting the reference values corresponding to a characteristic of the reproducing signal, and a correction circuit for correcting the reproducing signal or the calculated likelihood according to the detected reference values.

2 Claims, 13 Drawing Sheets

U.S. PATENT DOCUMENTS

| | | | | |
|---|---|---|---|---|
| 5,566,155 | A * | 10/1996 | Hayashi | 369/59.22 |
| 5,588,011 | A * | 12/1996 | Riggle | 375/341 |
| 5,592,347 | A * | 1/1997 | Mori et al. | 360/77.04 |
| 5,602,858 | A * | 2/1997 | Kitaori | 714/795 |
| 5,917,855 | A * | 6/1999 | Kim | 375/229 |
| 5,966,258 | A * | 10/1999 | Bliss | 360/46 |
| 6,587,520 | B1 * | 7/2003 | Coene et al. | 375/341 |
| 6,594,094 | B2 * | 7/2003 | Rae et al. | 360/25 |
| 6,661,761 | B2 * | 12/2003 | Hayami et al. | 369/59.21 |
| 6,678,105 | B2 * | 1/2004 | Melas | 360/45 |
| 6,842,303 | B2 * | 1/2005 | Ichihara et al. | 360/65 |
| 6,977,970 | B2 * | 12/2005 | Shim et al. | 375/317 |
| 7,173,783 | B1 * | 2/2007 | McEwen et al. | 360/46 |
| 7,215,631 | B2 * | 5/2007 | Horibe et al. | 369/124.1 |
| 7,219,296 | B2 * | 5/2007 | Takehara | 714/795 |

OTHER PUBLICATIONS

Kavcic, A., et al., "Correlation-Sensitive Adaptive Sequence Detection", IEEE Transactions on Magnetics, vol. 34, No. 3, May 1998, pp. 763-771.*

Sridharan, S., et al., "A 110 MHz 350 mW 0.6 um CMOS 16-State Generalized-Target Viterbi Detector for Disk Drive Read Channels", IEEE Transactions on Solid-State Circuits, vol. 35, No. 3, Mar. 2000, pp. 362-379.*

* cited by examiner

FIG. 5

| TIME | k-6 | k-5 | k-4 | k-3 | k-2 | k-1 | k |
|------|-----|-----|-----|-----|-----|-----|---|
| PM0  | 0   | 1   | 1   | 0   | 0   | 0   | x |
| PM1  | 0   | 0   | 0   | 0   | 0   | 1   | x |
| PM2  | 0   | 0   | 0   | 0   | 1   | 1   | x |
| PM3  | 0   | 1   | 1   | 1   | 0   | 0   | x |
| PM4  | 0   | 1   | 1   | 1   | 1   | 0   | x |
| PM5  | 0   | 1   | 1   | 1   | 1   | 1   | x |

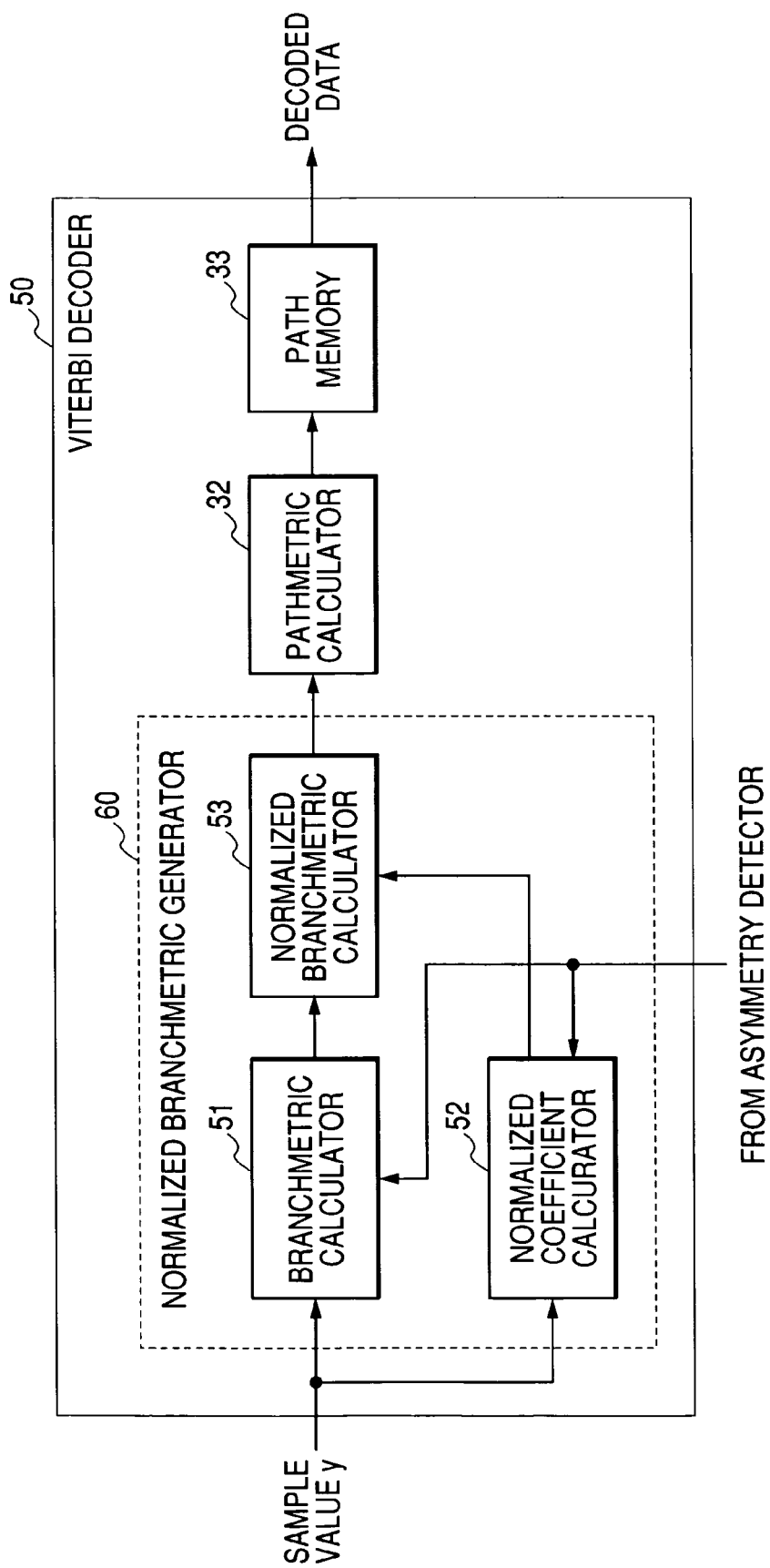

INFORMATION REPRODUCTION APPARATUS AND METHOD USING MAXIMUM LIKELIHOOD DECODING

BACKGROUND OF THE INVENTION

1. Field of the Invention

The present invention relates to an information reproduction method and an information reproduction apparatus, and more particularly to an information reproduction method and an information reproduction apparatus to be applied to an information recording medium such as an optical disk, a magneto-optical disk, a compact disk (CD), a compact disc recordable (CD-R) and the like.

2. Description of Related Art

There is conventionally known a Partial Response Maximum Likelihood (PRML) system as a signal processing system in an optical information reproduction apparatus such as an optical disk drive. In the PRML system, the waveform equalization of a reproducing signal is performed by a partial response (PR) system according to the characteristics of a recording and reproducing system, and decoding processing is performed by maximum likelihood decoding such as Viterbi decoding. Thereby, even if the reproducing signal is one having large intersymbol interference, data having a low error rate can be obtained. For calculating the likelihood of the Viterbi decoding, an ideal sampled value determined by the PR system used for the waveform equalization processing is used as the value of a discrimination point.

However, in an optical disk, the level of a reproducing signal is different from the discrimination point, which is uniquely determined according to the PR system, owing to nonlinear distortion such as the phenomenon called as asymmetry such that the eye pattern of a reproducing signal is asymmetry. The difference between the reproducing signal level and the discrimination point is a primary factor of the deterioration of the decoding performance of the Viterbi decoding.

To that problem, Japanese Patent Application Laid-Open No. 2001-250334 discloses an information reproduction apparatus and an information reproduction method which enable the discrimination point of the Viterbi decoding to be based on an actual reproduction waveform by setting the discrimination point on the basis of the maximum value and the minimum value of the amplitude of the shortest record information, the maximum value and the minimum value of the envelope of a reproducing signal, and the center value at the time of the binarization of the reproducing signal.

In the prior art, a discrimination point according to the asymmetry of a reproducing signal is set, and then the Viterbi decoding is performed. However, in the case were intervals between adjoining discrimination points become uneven owing to the correspondence to the asymmetry, the values of likelihood calculated at each time are dispersed, and consequently a problem in which the likelihood of the series of transitions at each time in the Viterbi decoding cannot be accurately judged is caused. The problem is described by referring to FIG. 9.

FIG. 9 shows values of discrimination points of the Viterbi decoding corresponding to PR(1, 2, 2, 1) which values are set according to asymmetry. The discrimination points in case of existing no asymmetry are seven of 0 to 6, but discrimination points $g_0$ to $g_6$ are set at uneven intervals correspondingly to nonlinear distortion such as the asymmetry in FIG. 9.

Hereupon, in the case where the value of a reproducing signal is 4.6 (B in FIG. 9), the likelihood between the value and discrimination points $g_4$ and $g_5$ are severally as follows.

$B(g_4)=(4.6-g_4)^2=0.16$ $B(g_5)=(4.6-g_5)^2=0.16$

Moreover, in the case where a value 1.6 (A in FIG. 9) of a reproducing signal, the likelihood between the value and the discrimination points $g_1$ and $g_2$ are severally as follows.

$B(g_1)=(1.6-g_1)^2=0.36$ $B(g_2)=(1.6-g_2)^2=0.36$

As shown in FIG. 9, the reproducing signal 4.6 is at a position distant from the discrimination points $g_4$ and $g_5$ equally, and the reproducing signal 1.6 is at a position distant from the discrimination points $g_1$ and $g_2$ equally. Consequently, it is suitable to consider that the probability that the reproducing signal 4.6 is the discrimination points $g_4$ or $g_5$ and the probability that the reproducing signal 1.6 is the discrimination points $g_1$ or $g_2$ are equal, but the above-mentioned branch metrics show different values from each other, 0.16 and 0.36. Thus, the probability disperses dependently on the relation between the reproducing signal and the discrimination point, and then the evaluation of a path metric at the time of the determination of the decoded data of the Viterbi decoding is not performed accurately. Consequently, the decoding property is lowered.

SUMMARY OF THE INVENTION

The present invention provides an apparatus and a method for performing the accurate maximum likelihood decoding of a reproducing signal including nonlinear distortion such as asymmetry therein.

An information reproduction apparatus of the present invention is an information reproduction apparatus using maximum likelihood decoding for calculating likelihood of a value of a reproducing signal to a plurality of reference values, the reproducing signal obtained from a recording medium, to decode the reproducing signal on the basis of the likelihood, the apparatus including:

a circuit for detecting the reproducing signal from the recording medium;

a circuit for detecting the reference values corresponding to a characteristic of the reproducing signal; and a correction circuit for correcting the reproducing signal or the calculated likelihood according to the detected reference values.

Moreover, an information reproduction method of the present invention is an information production method using maximum likelihood decoding for calculating likelihood of a value of a reproducing signal to a plurality of reference values, the reproducing signal obtained from a recording medium, to decode the reproducing signal on the basis of the likelihood, the method including the steps of:

detecting the reproducing signal from the recording medium;

detecting the reference values corresponding to a characteristic of the reproducing signal; and correcting the reproducing signal or the likelihood according to the detected reference values.

BRIEF DESCRIPTION OF THE DRAWINGS

FIG. 5 is a schematic diagram of path memories;

FIG. 15 is a block diagram of a fourth embodiment according to the present invention.

DETAILED DESCRIPTION OF THE PREFERRED EMBODIMENTS

In the following, the attached drawings are referred to while the preferred embodiments of the present invention are described.

First Embodiment

Figure 1:
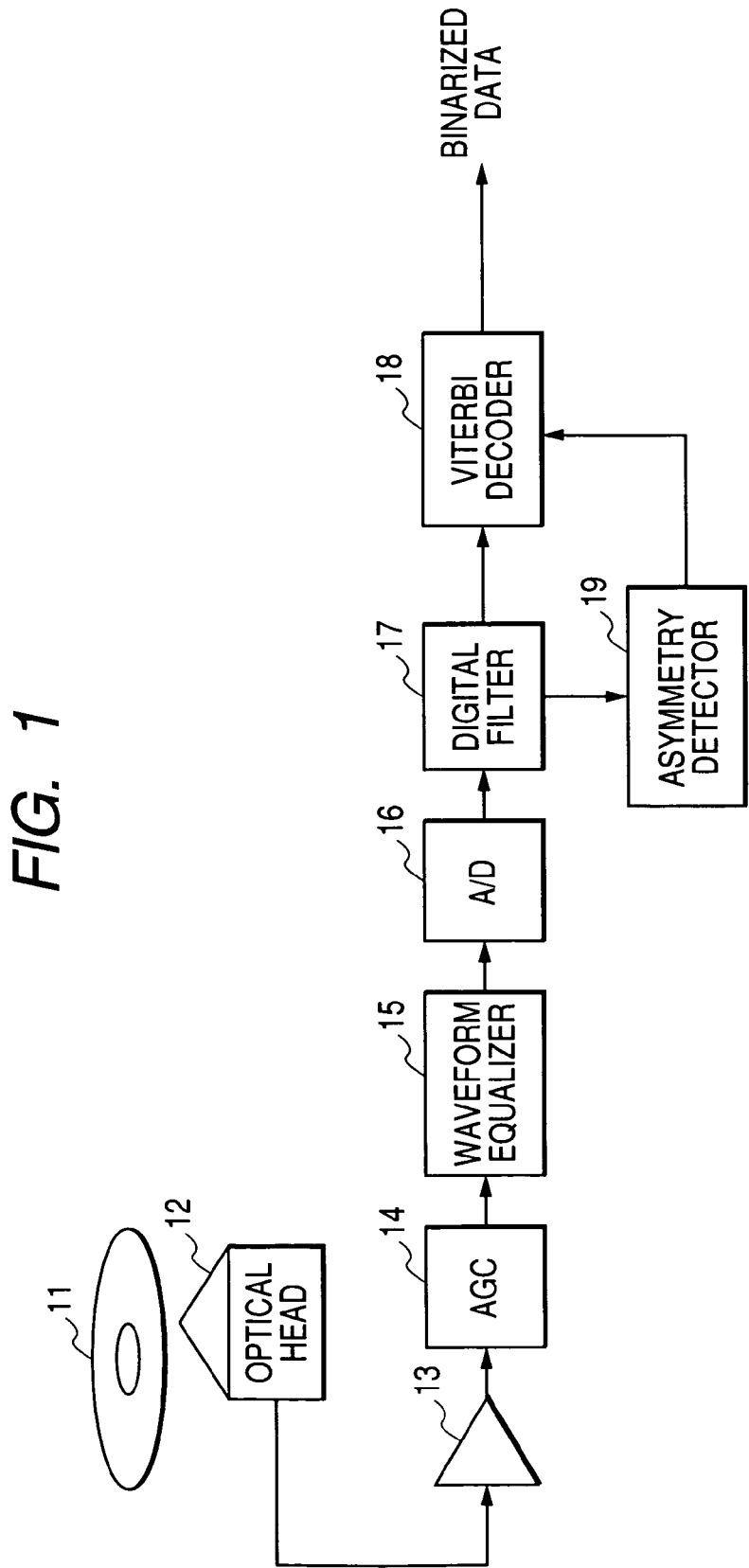
FIG. 1 is a block diagram of a first embodiment according to the present invention.

In the following, the drawings are referred to while a first embodiment of an information reproduction apparatus according to the present invention is described. FIG. 1 shows the first embodiment of the apparatus according to the present invention.

In FIG. 1, a reference numeral 11 denotes an optical disk, and is a medium on which the recording and the reproduction of information is optically performed. A reference numeral 12 denotes an optical head to detect a reproducing signal from the optical disk 11. A reference numeral 13 denotes a preamplifier to amplify a reproduced analog signal from the optical head 12. A reference numeral 14 denotes an automatic gain control (AGC) circuit to perform gain adjustment in order that signal amplitudes may become constant. A reference numeral 15 denotes a waveform equalizer to perform waveform shaping. A reference numeral 16 denotes an analog-digital (A/D) converter to sample the reproduced analog signal for converting the analog signal to a digital reproducing signal.

A reference numeral 17 denotes a digital filter to equalize the converted digital reproducing signal to have a desired PR characteristic. A reference numeral 18 denotes a Viterbi decoder to calculate a metric from the PR equalized signal for generating decoded data. A reference numeral 19 denotes an asymmetry detector to detect asymmetry on the basis of the equalized signal for supplying a discrimination value corresponding to the asymmetry to the Viterbi decoder 18.

Figure 6:
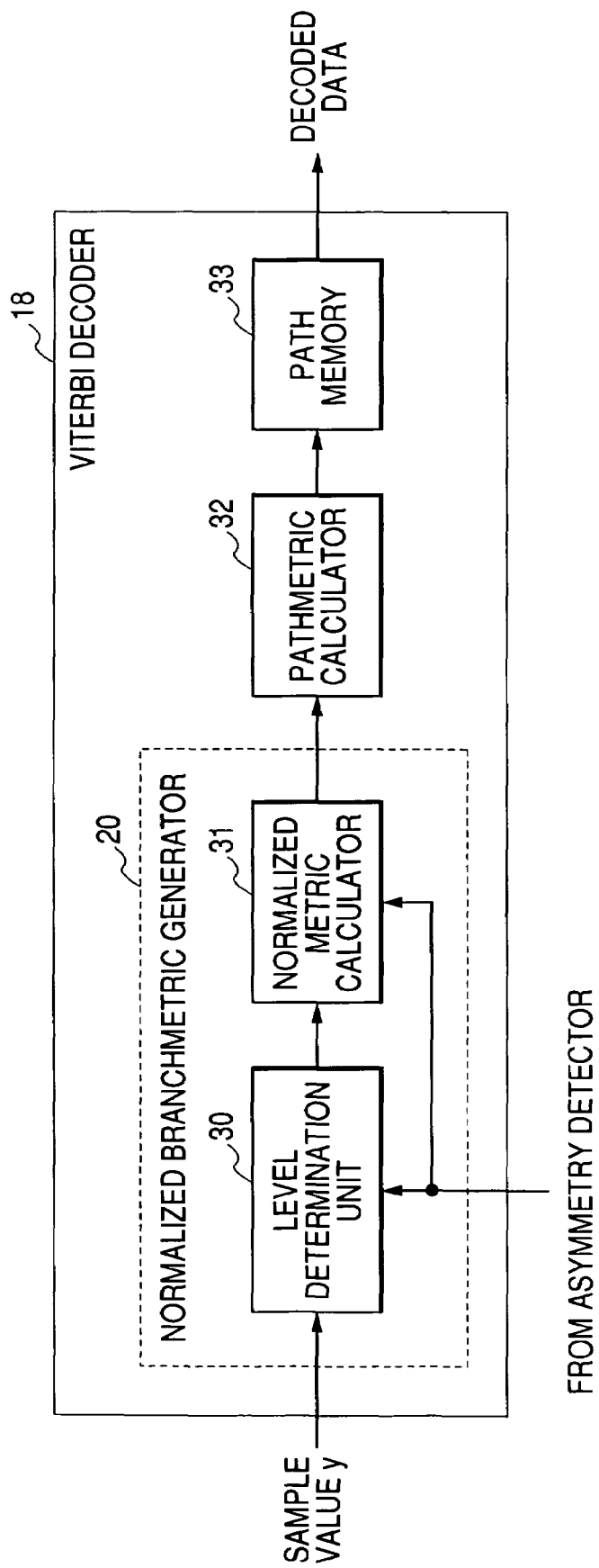
FIG. 6 is a block diagram of a Viterbi decoder of the first embodiment according to the present invention.

Now, the operation of the Viterbi decoder 18 shown in FIG. 6 is described. FIG. 6 is a diagram showing the internal blocks of the Viterbi decoder 18. The Viterbi decoder is composed of a normalized branch metric generator 20 for calculating a normalized branch metric at each time, a path metric calculator 32 for calculating the probability of a path to transit to each state, and a path memory 33 holding decoded data corresponding to a path to transit to each state. The normalized branch metric generator 20 is composed of a level determination unit 30 and a normalized metric calculator 31. The details of the normalized branch metric generator 20 will be described later.

Figure 2:
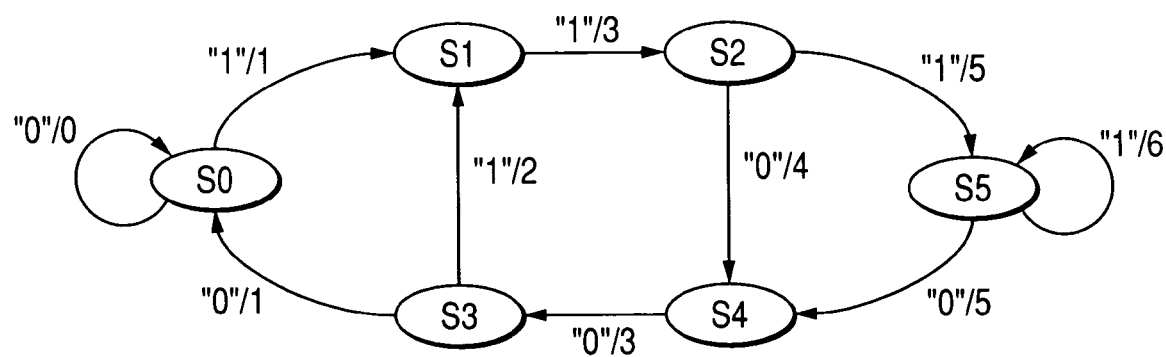
FIG. 2 is a state transition diagram illustrating state transitions of Viterbi decoding.

FIG. 2 shows a state transition diagram of the Viterbi decoding by the PR(1, 2, 2, 1). Incidentally, FIG. 2 shows the case where an RLL(1, 7) code is used as a recording code and the recoding code is recoded by receiving the NRZI conversion at the time of recording. In the case where the PR system using the PR(1, 2, 2, 1) is used, the decoding process can be expressed by the transitions of six states, as shown in FIG. 2. Hereupon, it is supposed that the states S(0, 0, 0), S(0, 0, 1), S(0, 1, 1), S(1, 0, 0), S(1, 1, 0) and S(1, 1, 1) at each time are denoted as $S_0$, $S_1$, $S_2$, $S_3$, $S_4$ and $S_5$, respectively.

Incidentally, the state $S(d_{k-2}, d_{k-1}, d_k)$ indicates that the decoded data at present time is $d_k$, the decoded data before a time is $d_{k-1}$ and the decoded data before two times is $d_{k-2}$. Moreover, the ideal sampled value by the decoded data and PR(1, 2, 2, 1) at the time of each transition is denoted as $d_k/P_k$.

Figure 3:
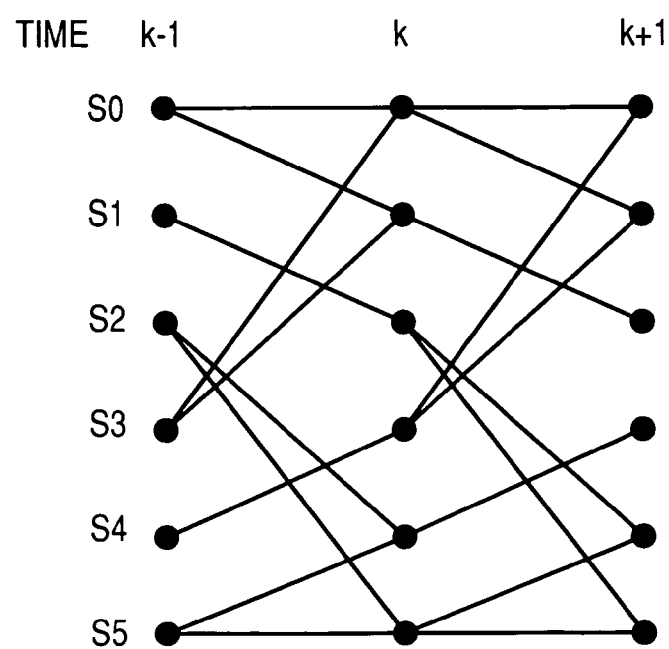
FIG. 3 is a trellis diagram illustrating the state transitions of the Viterbi decoding.

FIG. 3 is a trellis diagram obtained by expanding the state transition diagram of FIG. 2 into the time axis direction. In the Viterbi decoding, the path metrics $m_0[k]$ to $m_s[k]$ of respective states $S_0$ to $S_5$ at a time k are expressed as follows by using the metrics $m_0[k-1]$ to $m_5[k-1]$ of a predetermined state at the time k−1 and an actual output value y[k] at the time k.

(Formula 1)

$$m_0[k]=\min\{m_0[k-1]+(y'[k]-a_0)^2, m_3[k-1]+(y'[k]-a_1)^2\}$$

$$m_1[k]=\min\{m_0[k-1]+(y'[k]-a_1)^2, m_3[k-1]+(y'[k]-a_2)^2\}$$

$$m_2[k]=m_1[k-1]+(y'[k]-a_3)^2$$

$$m_3[k]=m_4[k-1]+(y'[k]-a_3)^2$$

$$m_4[k]=\min\{m_5[k-1]+(y'[k]-a_5)^2, m_2[k-1]+(y'[k]-a_4)^2\}$$

$$m_5[k]=\min\{m_5[k-1]+(y'[k]-a_6)^2, m_2[k-1]+(y'[k]-a_5)^2\}$$

where a0 to a6 in the above-mentioned formula (1) denote amplitude reference values. The amplitude reference values may not correspond to the asymmetry. Hereupon, y' denotes a normalized reproducing signal.

Because two pathes join at each time in the states $S_0$, $S_1$, $S_4$ and $S_5$, a joining path having a smaller path metric value of the two joining pathes is selected as a survival path.

Moreover, as shown in the trellis diagram of FIG. 3, the normalized metric calculator 31 calculates an Euclidian distance between the ideal sampled value of the PR(1, 2, 2, 1) determined according to each transition and an output value obtained by normalizing processing of an actually reproduced signal as a branch metric, and the path metric calculator 32 adds branch metrics in accordance with the formula (1) and compares the path metrics to select a probable path for sequentially updating the path metrics at the time of the transition from each state at time k−1 to each state at time k. Incidentally, the ideal sampled values of the PR(1, 2, 2, 1) are seven values of 0, 1, 2, 3, 4, 5 and 6.

The Viterbi decoder 18 calculates the metric values of the pathes leading to each state in accordance with the above-mentioned formula (1) at each time. Moreover, the Viterbi decoder 18 updates the path memory 33 according to the decoded data corresponding to each path.

Figure 4:
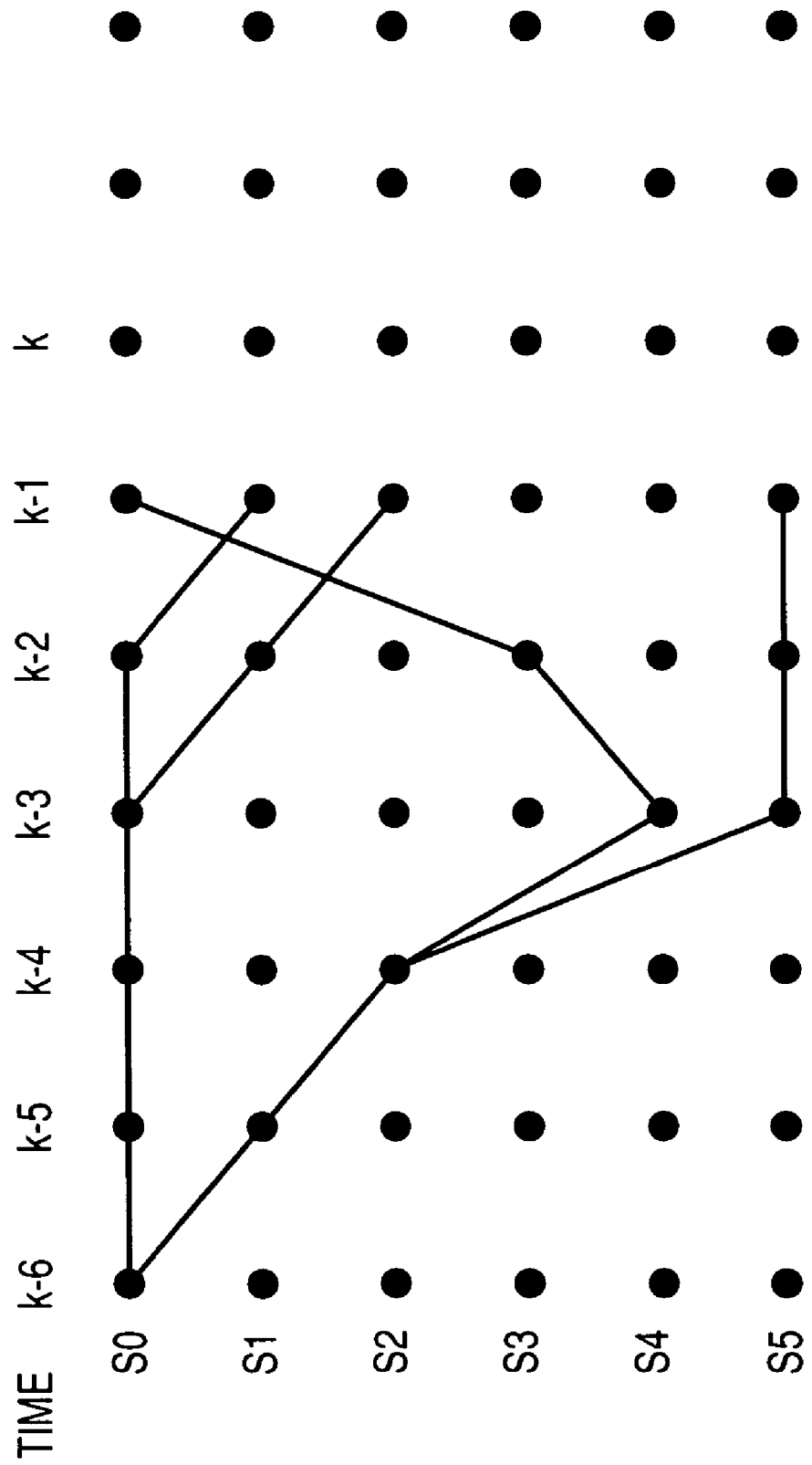
FIG. 4 is a diagram illustrating an outline of the decoding operation of the Viterbi decoding.

FIG. 5 shows the path memory 33 corresponding to survival pathes leading to each of the states $S_0$ to $S_5$ at the time k in the case where the state transitions have been performed as shown in the trellis diagram of FIG. 4. It is possible to estimate the binarized data of the Viterbi decoder by comparing the likelihood of each state at the time k to determine the most probable state, and by referring to the path memory 33 of the state.

Figure 7:
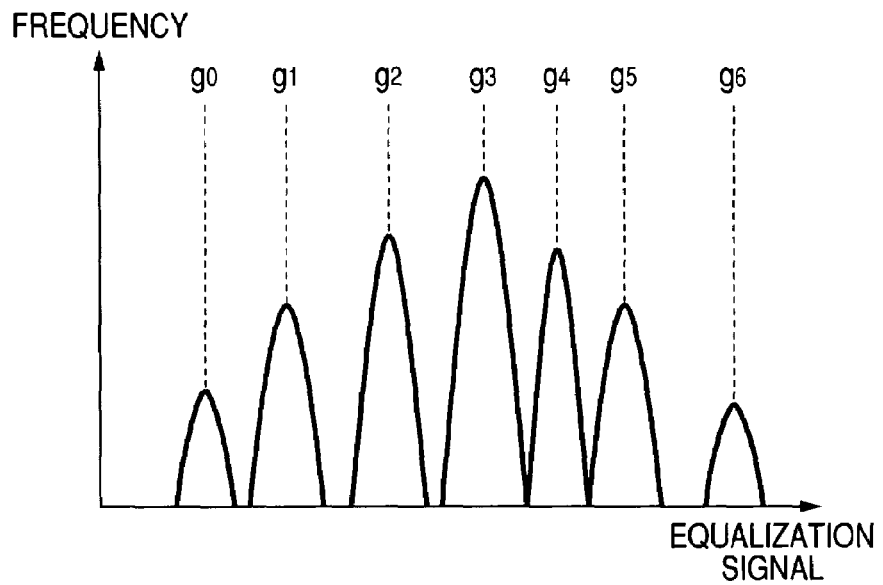
FIG. 7 is a diagram illustrating the asymmetry of a reproducing signal.

The asymmetry detector 19 detects discrimination values corresponding to asymmetry. As described above, in the characteristic of the PR(1, 2, 2, 1), the levels of the discrimination points are ideally seven values of 0 to 6. However, when asymmetry exists at the time of obtaining a distribution of equalization signals as shown in FIG. 7, the peak positions of the levels of the discrimination points are shifted from the ideal ones, as shown in FIG. 7. Hereupon, it is supposed that the discrimination values $g_0$ to $g_6$ as shown in FIG. 7 are obtained on the basis of the average value of the distribution of each of the seven levels, which has been extracted by reproducing predetermined regions in which recorded signals have been already known.

Incidentally, it is needless to say that the other known techniques such as one disclosed in the above-mentioned Japanese Patent Application Laid-Open No. 2001-250334 can be used for the detection of the discrimination values.

Moreover, the asymmetry may be detected on the basis of a reproducing signal in a predetermined learning area to perform the decoding processing after that by using the detected value, or it is also possible to update the reference values sequentially by performing the statistical processing of a signal corresponding to each reference value by means of the signals during user data reproduction.

Figure 8:
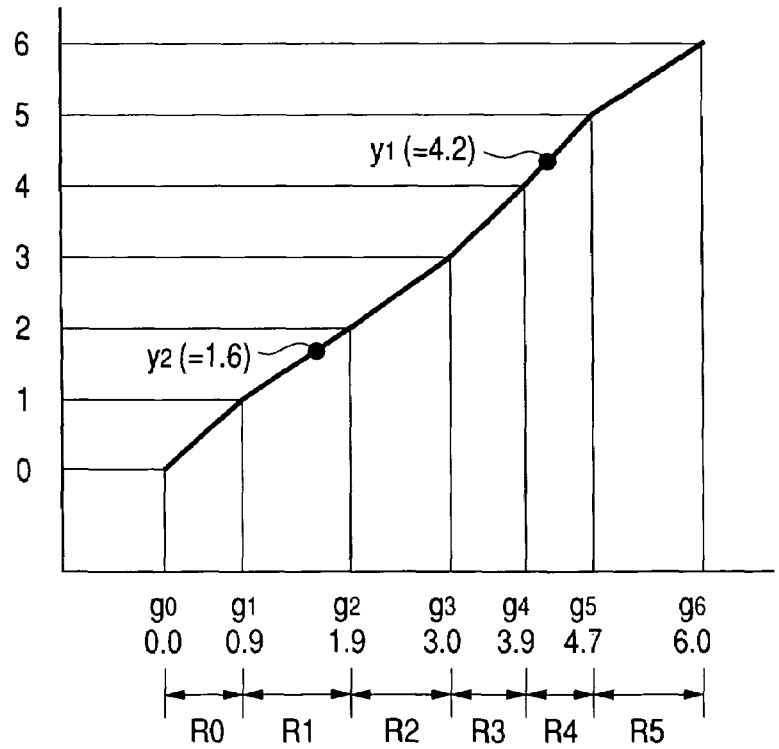
FIG. 8 is a diagram illustrating the correction corresponding to the asymmetry.
Figure 9:
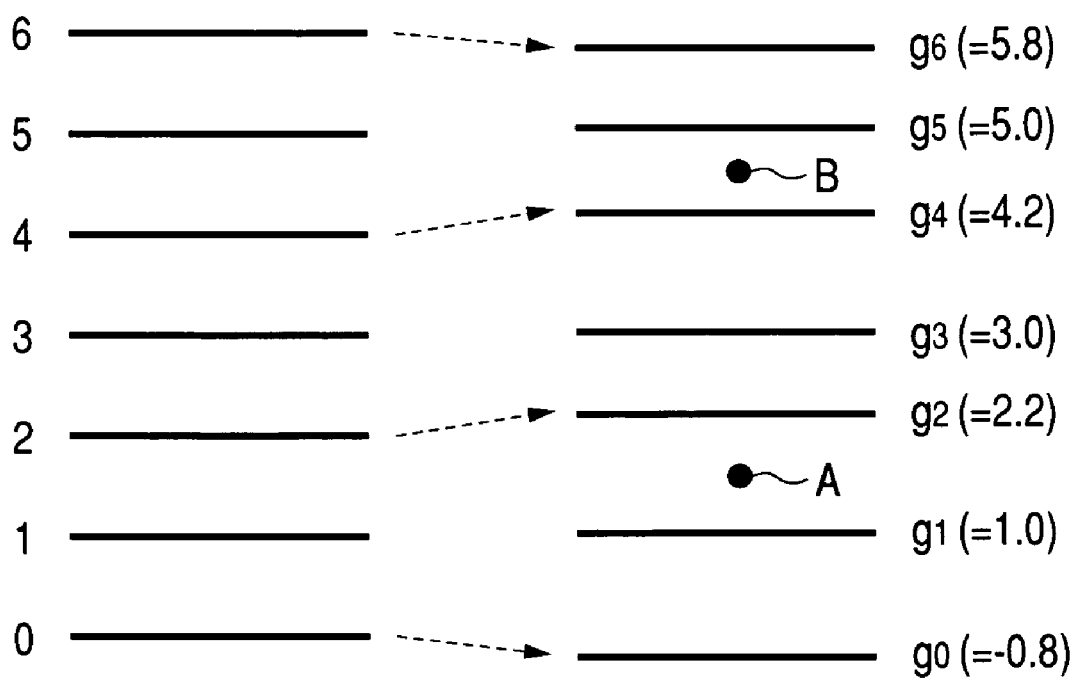
FIG. 9 is a schematic diagram of reference values of the Viterbi decoding and reproducing signals.

Next, the operation of the normalized branch metric generator 20, which is a feature of the present invention, shown in FIG. 6 is described. At the time of the generation of a branch metric, a reproducing signal is normalized in the state in which the interval of each discrimination point is set to be one in the present embodiment. FIG. 8 shows the outline of the normalization. FIG. 8 shows the discrimination values $g_0$ to $g_6$ corresponding to the asymmetry and reproducing signals $y_1$ and $y_2$. Hereupon, the case where the discrimination values $g_0$ to $g_6$ are supposed as follows is shown for illustration: $g_0=0.0$, $g_1=0.9$, $g_2=1.9$, $g_3=3.0$, $g_4=3.9$, $g_5=4.7$ and $g_6=6.0$. For example, in case of the reproducing signal $y_1=4.2$, the value is positioned between the discrimination values $g_4$ and $g_5$. Consequently, the reproducing signal $y_1'$ after the normalization thereof becomes as follows.

$$y_1'=4.0+(y_1-g_4)/(g_5-g_4)=4.0+(4.2-3.9)/(4.7-3.9)=4.375$$

Moreover, in case of $y_2=1.6$, the value is positioned between the discrimination values $g_1$ and $g_2$. Consequently, the reproducing signal $y_2'$ after the normalization thereof becomes as follows.

$$y_2'=1.0+(y_2-g_1)/(g_2-g_1)=1.0+(1.6-0.9)/(1.9-0.9)=1.7$$

In the normalized branch metric generator 20, the level determination unit 30 determines which range of the ones of $R_0$ to $R_5$ in FIG. 8 a reproducing signal exists in on the basis of the reproducing signal and the discrimination value corresponding to the asymmetry. The normalized metric calculator 31 normalizes the reproducing signal to generate a branch metric on the basis of the reproducing signal, the level determination result and the discrimination value corresponding to the asymmetry, as described above. The normalized branch metric is output to the path metric calculator 32. After that, a binarized output can be obtained by the decoding processing similar to the ordinal Viterbi decoding.

As described above, in the present embodiment, because the reproducing signal is normalized on the basis of the discrimination value corresponding to the asymmetry, the branch metric of the Viterbi decoding can be calculated by using ideal amplitude reference values $a_0$ to $a_6$. Moreover, because the dispersion of the branch metrics owing to the discrimination values having uneven intervals corresponding to the asymmetry is eliminated, accurate decode processing can be performed.

Second Embodiment

Figure 11:
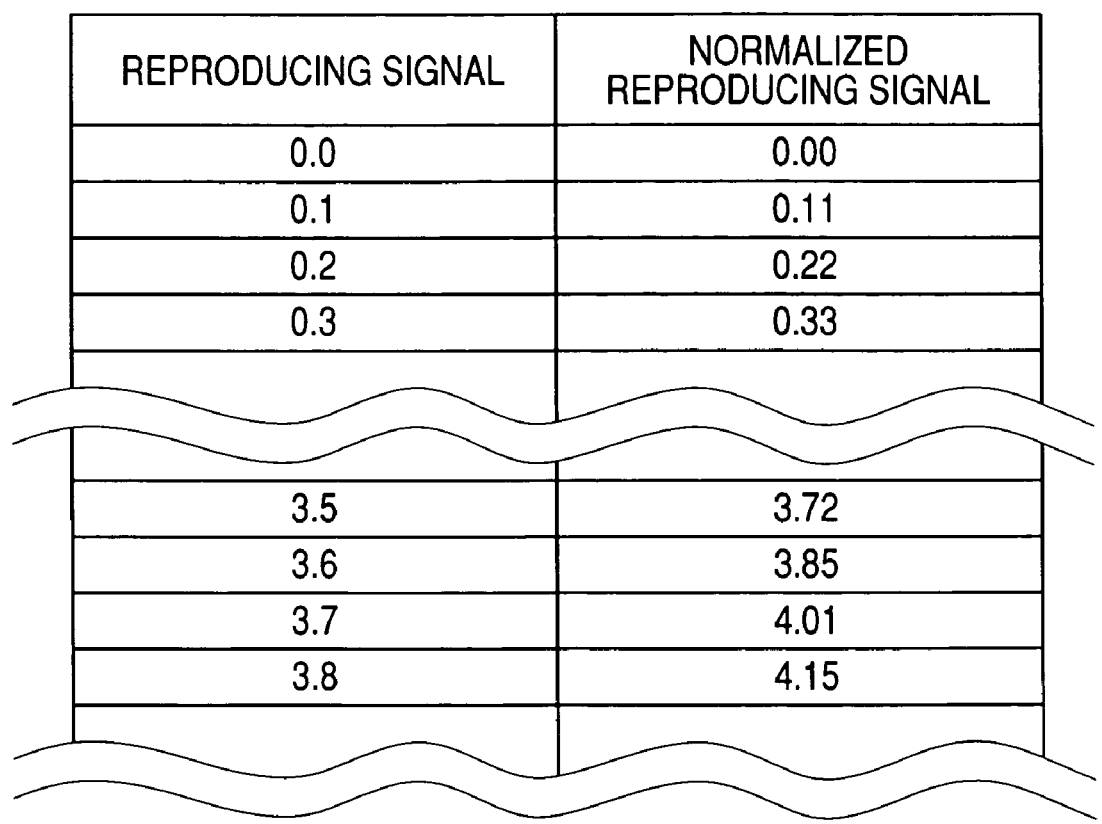
FIG. 11 is a schematic view of a correction value table of reproducing signals.

In the present embodiment, an interval of each discrimination value corresponding to asymmetry is digitized by means of a predetermined value, and a table, in which the value of a reproducing signal after the normalization corresponding to the reproducing signal is calculated, is produced, and the produced table is held in the memory. FIG. 11 shows the outline of the table, and the reproducing signals after normalization corresponding to the values of the reproducing signals can be obtained by referring to the table.

Figure 10:
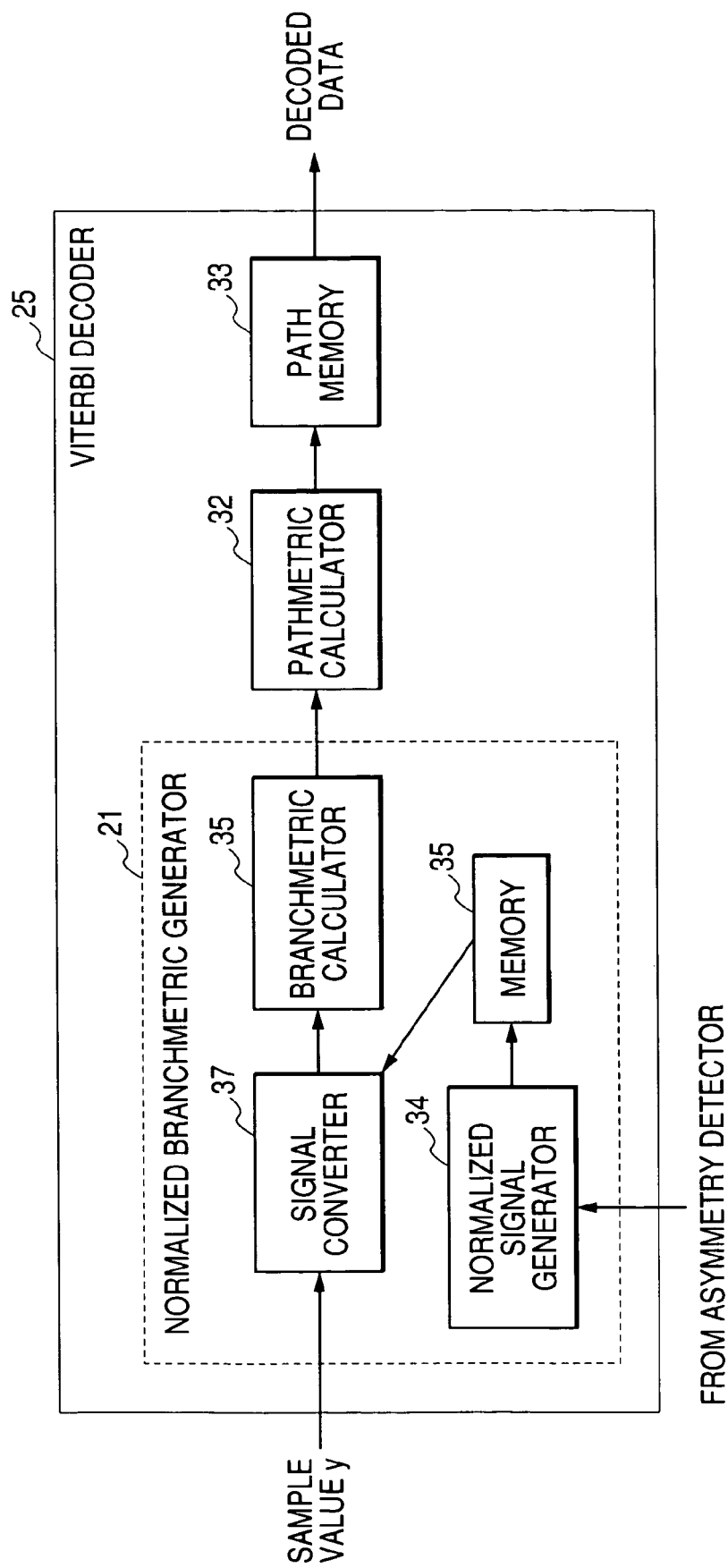
FIG. 10 is a block diagram of a Viterbi decoder of a second embodiment according to the present invention.

FIG. 10 is a block diagram showing the configuration of the Viterbi decoder 25 of the present embodiment. A normalized branch metric generator 21 detects asymmetry from a predetermined reproducing signal, and a normalized signal generator 34 generates a normalized signal corresponding to the reproducing signal digitized at a predetermined interval. The generated normalized signal is stored in a memory 36.

When a reproducing signal y is input, a signal converter 37 reads a normalized reproducing signal by referring to the memory 36 on the basis of the level of the reproducing signal. A branch metric calculator 35 calculates a branch metric on the basis of the normalized reproducing signal.

The normalized branch metric is output to a path metric calculator 32. After that, the operation of the embodiment is similar to that of the first embodiment.

Third Embodiment

Figure 12:
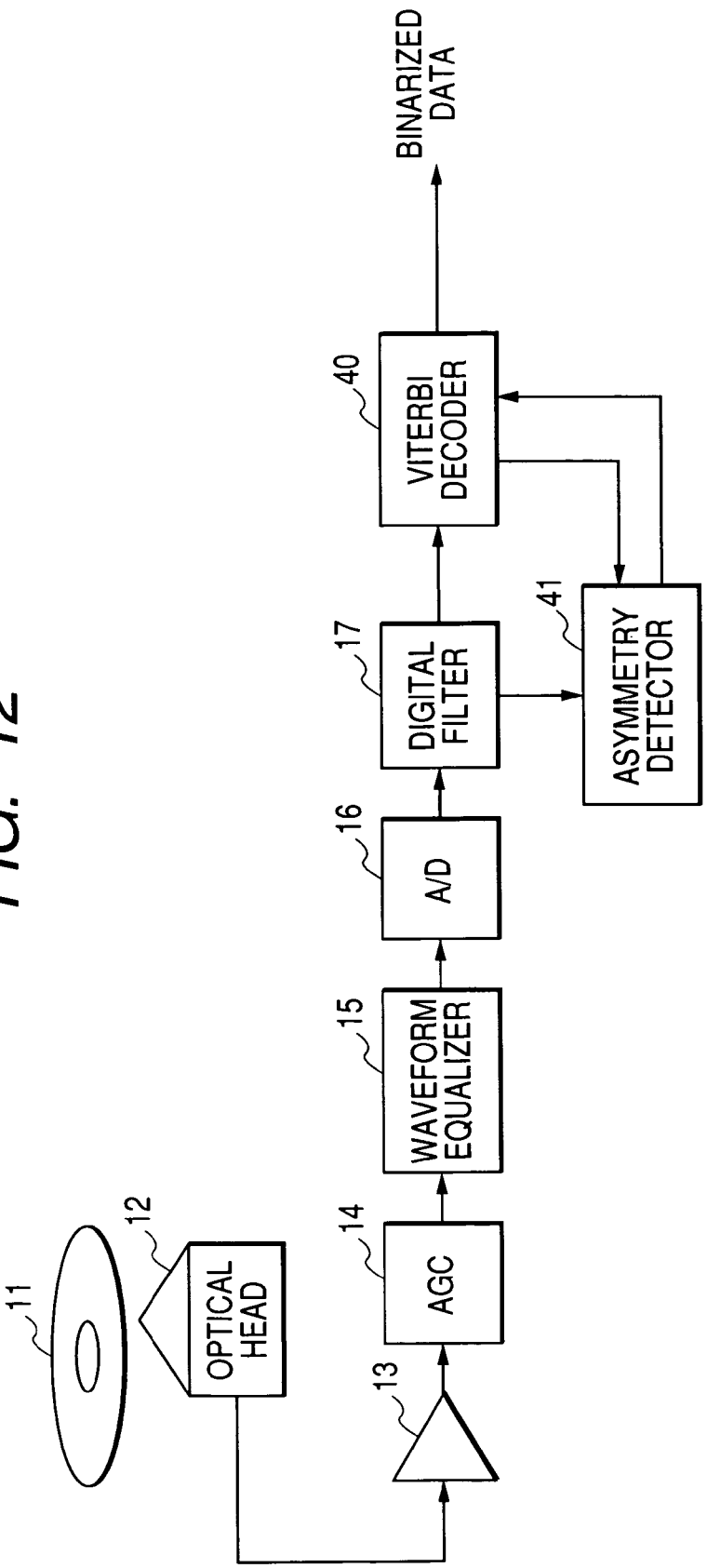
FIG. 12 is a block diagram of a third embodiment according to the present invention.

FIG. 12 shows a block diagram of a third embodiment according to the present invention. The present embodiment is configured to calculate an ideal value corresponding to an equalized signal on the basis of binarized data as a decoding result of the Viterbi decoding. In FIG. 12, a Viterbi decoder 40 executes decoding operation on the basis of a discrimination value updated sequentially by an asymmetry detector 41.

Figure 13:
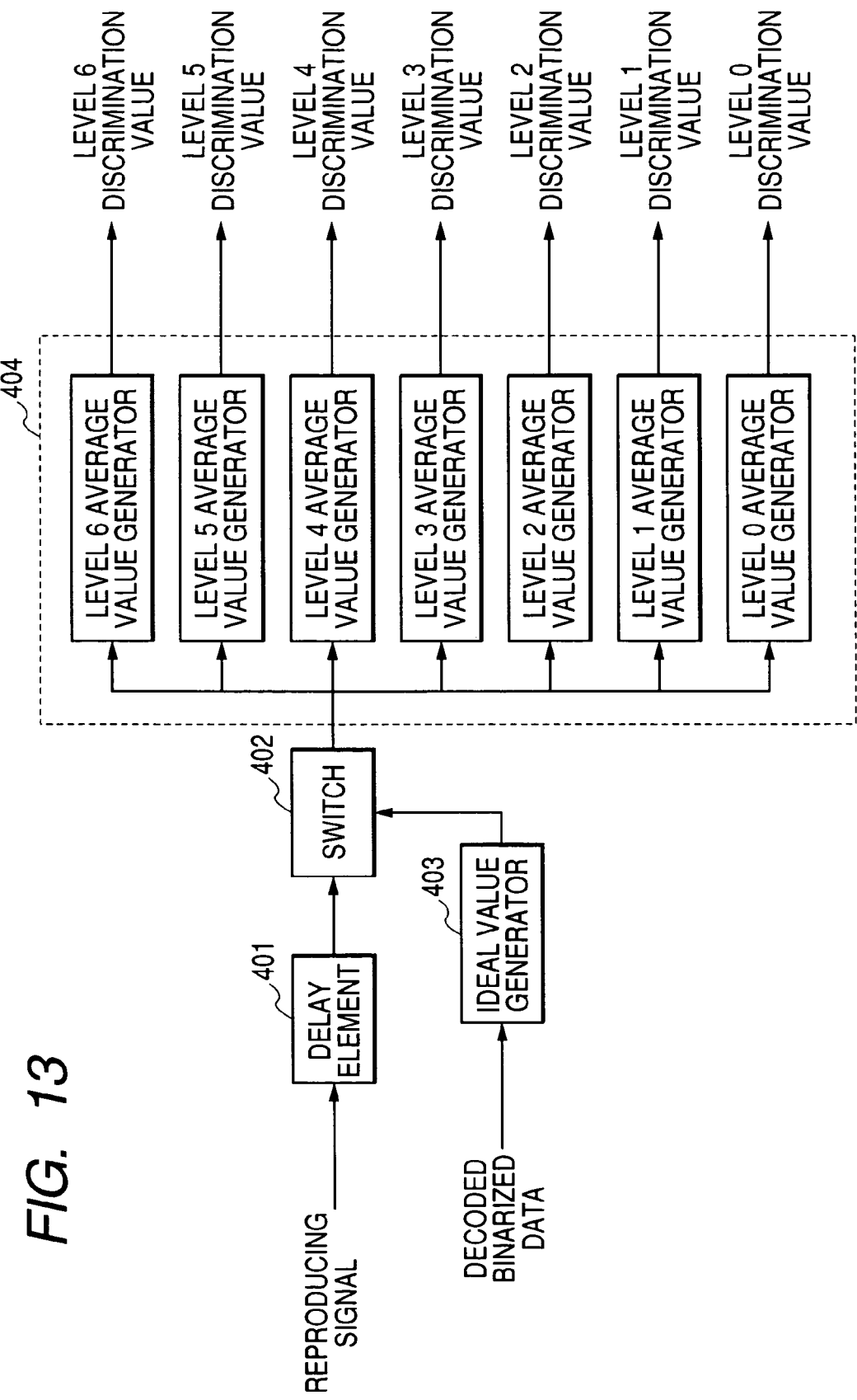
FIG. 13 is a schematic diagram of an asymmetry detector of the third embodiment according to the present invention.

Now, the case where the reference value by asymmetry is sequentially updated is described. FIG. 13 shows the outline of the asymmetry detector 41. In FIG. 13, a reference numeral 401 denotes a delay element for delaying an equalized reproducing signal from a digital filter for a predetermined time to synchronize the delayed signal with the decoded binarized data obtained from the Viterbi decoder 40. An ideal value generator 403 calculates an ideal equalized signal having the characteristic of the PR(1, 2, 2, 1) on the basis of a decoded binarized data train to generate an ideal equalized signal to the equalized reproducing signal. A switch 402 distributes the equalized reproducing signal to an average value generator 404 corresponding to each ideal value on the basis of the ideal equalized signal.

The average value generator 404 sequentially performs the averaging processing of actual equalized reproducing signals corresponding to each ideal value over predetermined sampling, and outputs the averaged value to the Viterbi decoder 40 as the discrimination value corresponding to the asymmetry. The internal operation of the Viterbi decoder 40 is similar to that of the first embodiment.

Consequently, the apparatus of the present embodiment always generates discrimination values corresponding to the state of a reproducing signal flexibly to supply the generated discrimination values to the Viterbi decoder 40. Thereby, the accuracy of the normalized metric generation is remarkably improved. Therefore, even if the state of a signal varied, the optimum decoding operation can be realized, and then the decoding property having a low error rate can be obtained.

Moreover, the apparatus is configured to calculate the ideal value corresponding to the equalized signal on the basis of the binarized data as the decoding result of the Viterbi decoding, the reliability at the time of the detection of the discrimination values by the asymmetry detector 41 is improved.

Fourth Embodiment

The characteristic of the present embodiment is a calculation method of a branch metric of the Viterbi decoding. Because the other configurations of the embodiment are similar to those of the first embodiment, the configurations are omitted to be described.

Figure 14:
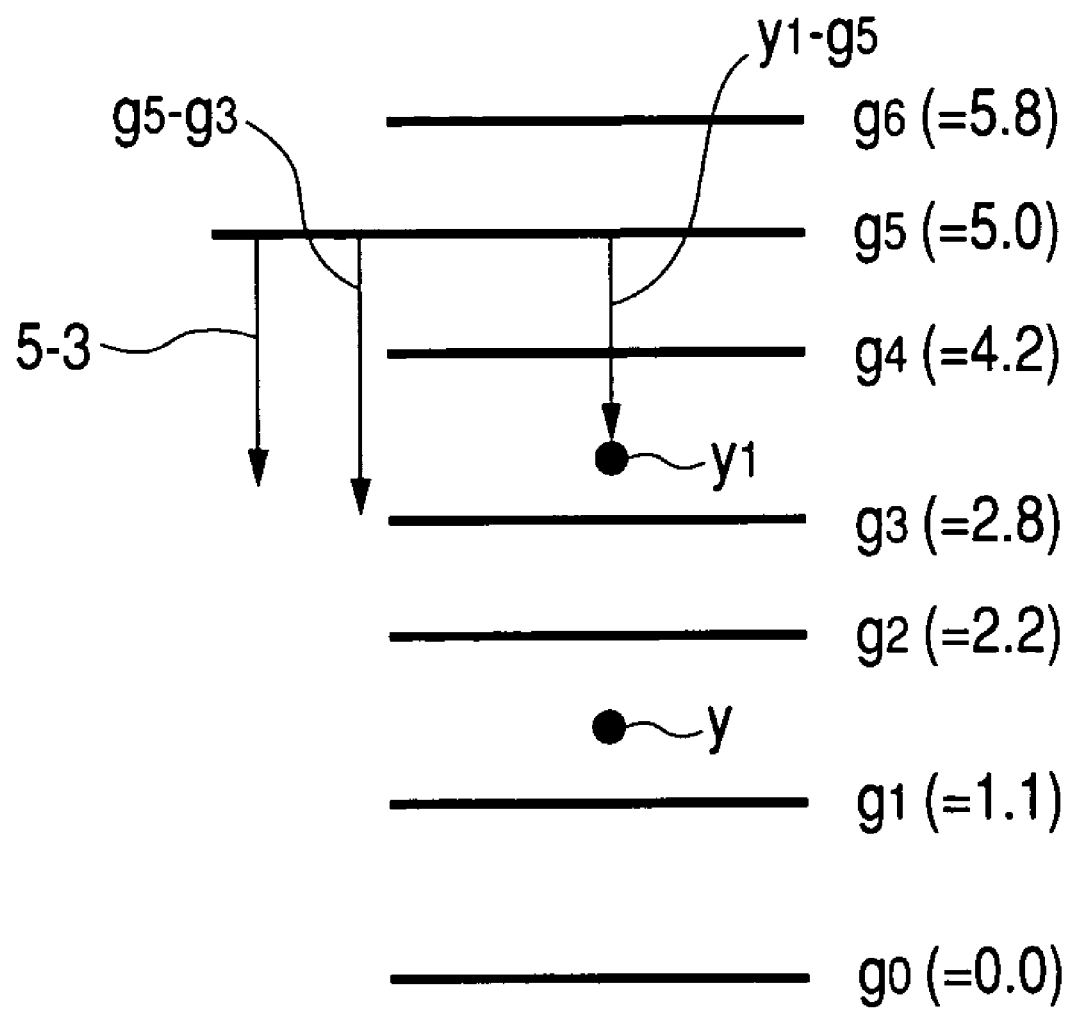
FIG. 14 is a diagram for illustrating the normalization of branch metrics.

FIG. 14 shows the outline of the calculation of the branch metric. As shown in FIG. 14, the reference values $g_0$ to $g_6$ have been obtained by the asymmetry detector. Now, when a reproducing signal y1 is given, a branch metric $B_5$ corresponding to the asymmetry of a path transiting from the states $S_2$ to $S_5$ in FIG. 3 is calculated as follows.

$$B_5 = (y_1 - g_5)^2$$

Next, the distance from the discrimination values $g_5$ to $g_3$ corresponding to the asymmetry is normalized by the distance 2 (=5−3) of the ideal values to correct the branch metric.

$$B'_5 = B_5 \times \{2/(g_5 - g_3)\}^2$$

The other branch metrics similarly undergo the normalization processing, and path metrics are calculated on the basis of the normalized branch metrics to perform the Viterbi decoding. Thereby, even if the reference values of the Viterbi decoding are shifted for the correspondence to the asymmetry, the branch metrics can be obtained accurately.

FIG. 15 is a block diagram of a Viterbi decoder 50 according to the present embodiment. Incidentally, the reference values of the Viterbi decoding are supposed to use the discrimination values $g_0$ to $g_6$ of FIG. 14. The branch metrics to be calculated are the following seven.

$$B_0 = (y - g_0)^2$$

$$B_1 = (y - g_1)^2$$

$$B_2 = (y - g_2)^2$$

$$B_3 = (y - g_3)^2$$

$$B_4 = (y - g_4)^2$$

$$B_5 = (y - g_5)^2$$

$$B_6 = (y - g_6)^2$$

Moreover, coefficients $K_0$ to $K_6$ for normalizing the branch metrics are calculated. For example, in case of an equalized signal y=1.6 as shown in FIG. 14, the normalizing coefficients $K_0$ to $K_6$ are as follows.

$$K_0 = \{2/(g_2 - g_0)\}^2$$

$$K_1 = \{1/(g_2 - g_1)\}^2$$

$$K_2 = \{1/(g_2 - g_1)\}^2$$

$$K_3 = \{2/(g_3 - g_1)\}^2$$

$$K_4 = \{3/(g_4 - g_1)\}^2$$

$$K_5 = \{4/(g_5 - g_1)\}^2$$

$$K_6 = \{5/(g_6 - g_1)\}^2$$

Consequently, a branch metric calculator 51 in FIG. 15 calculates the branch metrics $B_0$ to $B_6$ on the basis of the equalized signals and the reference values obtained from the asymmetry detector, and the normalizing coefficients K0 to K6 are calculated by a normalized coefficient calculator 52.

Next, a normalized branch metric calculator 53 generates normalized branch metrics by performing the multiplication of the branch metrics by the normalization coefficients.

$$B'_n = B_n \times K_n \ (n=0 \text{ to } 6)$$

After that, path metrics are calculated on the basis of the normalized branch metrics to perform the Viterbi decoding processing.

In the present embodiment, the branch metrics are calculated on the basis of the reference values corresponding to asymmetry, and the branch metrics are normalized according to the intervals of the reference values. Consequently, the accuracy of the path metrics is improved, and the decoding performance is improved.

The discrimination values according to the asymmetry as the discrimination values corresponding to nonlinear distortion are adopted to be described in the embodiments described above. There are the other primary factors of the shifts of the reference values other than the asymmetry such as 1) an offset is generated in a reproducing signal, 2) the envelope (the amplitude of a reproducing signal) varies and 3) an error in the waveform equalizer. Also in these cases, the present invention can be applied.

Incidentally, the circuits for processing a digital reproducing signal (the Viterbi decoder, the asymmetry detector and the like) my be hard configurations designed for exclusive use, or all of or a part of the processing of the circuits may be commonly born by a CPU for performing other processing.

This application claims priority from Japanese Patent Application No. 2003-407577 filed Dec. 5, 2003, which is hereby incorporated by reference herein.

What is claimed is:

1. An information reproduction apparatus using maximum likelihood decoding for calculating likelihood of a value of a reproducing signal obtained from a recording medium, using a plurality of reference values, to decode the reproducing signal on the basis of the likelihood, said apparatus comprising:

a circuit for detecting the reproducing signal from said recording medium;

a circuit for detecting the reference values corresponding to a characteristic of the reproducing signal; and a correction circuit for correcting the likelihood according to the detected reference values, wherein said correction circuit normalizes a branch metric on the basis of an interval between the detected reference values.

2. An information reproduction method using maximum likelihood decoding for calculating likelihood of a value of a reproducing signal obtained from a recording medium, using a plurality of reference values to decode the reproducing signal on the basis of the likelihood, said method comprising the steps of:

detecting the reproducing signal from said recording medium;

detecting the reference values corresponding to a characteristic of the reproducing signal; and correcting the likelihood according to the detected reference values, wherein, at said step of correcting, a branch metric is normalized on the basis of an interval between the detected reference values.

* * * * *